US006559658B1

(12) United States Patent
Brandt

(10) Patent No.: US 6,559,658 B1
(45) Date of Patent: May 6, 2003

(54) NOISE RESISTANT ELECTRONIC PRESENCE SENSOR

(75) Inventor: David D. Brandt, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 30 days.

(21) Appl. No.: 09/671,382

(22) Filed: Sep. 27, 2000

(51) Int. Cl.[7] .................... G01R 27/26
(52) U.S. Cl. .................... 324/681; 324/530; 324/661
(58) Field of Search .................... 324/639, 641, 324/644, 451, 452, 469, 501, 502, 520, 529, 530, 615, 627, 661, 681; 340/540, 573, 575, 545.3, 561.1, 567, 551–557; 361/179, 181

(56) References Cited

U.S. PATENT DOCUMENTS

| | | | | | |
|---|---|---|---|---|---|
| 5,166,679 | A | * | 11/1992 | Vranish et al. | 340/870.37 |
| 5,521,515 | A | * | 5/1996 | Campbell | 324/674 |
| 5,600,253 | A | * | 2/1997 | Cohen et al. | 324/644 |
| 5,739,695 | A | * | 4/1998 | Zerod et al. | 324/637 |
| 5,844,415 | A | * | 12/1998 | Gershenfeld et al. | 324/663 |
| 6,020,812 | A | * | 2/2000 | Thompson et al. | 340/438 |
| 6,066,954 | A | | 5/2000 | Gershenfeld et al. | |
| 6,242,927 | B1 | * | 6/2001 | Adams et al. | 324/664 |
| 6,392,542 | B1 | * | 5/2002 | Stanley | 340/561 |

FOREIGN PATENT DOCUMENTS

| | | |
|---|---|---|
| FR | 2712404 | 5/1995 |
| WO | WO 97 41458 | 11/1997 |

* cited by examiner

*Primary Examiner*—Kamand Cuneo
*Assistant Examiner*—Tung X. Nguyen
(74) *Attorney, Agent, or Firm*—Adam J. Forman; Alexander M. Gerasimow; William R. Walbrun

(57) ABSTRACT

An electromagnetic field presence sensor independently evaluates the presence or absence of an object in a variety of frequency ranges. Conflicting indications of the presence of the object in these different ranges, such as may be caused by electromagnetic interference, is resolved through a voting system. In this way, band limited noise may be resisted while improving the sensitivity of the sensor and without reducing its response speed.

14 Claims, 1 Drawing Sheet

NOISE RESISTANT ELECTRONIC PRESENCE SENSOR

CROSS-REFERENCE TO RELATED APPLICATIONS

- - -

STATEMENT REGARDING FEDERALLY SPONSORED RESEARCH OR DEVELOPMENT

- - -

BACKGROUND OF THE INVENTION

The present invention relates generally to active sensors for electronically sensing the presence of an object and in particular to such a sensor having improved noise immunity.

The presence or absence of an object may be detected by measuring the interaction of the object with an electromagnetic field generated in a sensing volume. The object, when in the sensing volume, introduces a new or changed impedance into the circuit generating the electromagnetic field through capacitive or inductive coupling. Sensors that provide the source of the electromagnetic field used for sensing will be termed "active" sensors.

In a capacitive presence sensor, for example, an object may increase a capacitive coupling between an electrode of the generating circuit and environmental ground return paths. In an inductive presence sensor, the object may inductively couple to an antenna of the generating circuit to change the effective inductance of that antenna.

This change in impedance, caused by the introduction of an object within the sensing area, is manifest as an energy transfer from the generating circuit to the object, such energy transfer being detected by a sensing circuit, for example, as increased current flow. The amount of energy transfer may be compared against a threshold to produce a binary, switched output indicating the presence or absence of an object within the sensed area.

Such electromagnetic field presence sensors do not require direct physical or electrical (ohmic) contact with the object and thus can be easily sealed against water and dirt for use in hostile industrial environments.

A tradeoff exists between the degree of sensitivity of such presence sensors and thus their ability to be triggered by small or remote objects, (e.g. a hand separated from the sensor by a thick glove), and their susceptibility to noise. As the sensitivity of the sensor is increased (increasing the sensing volume or decreasing the size of the object sensed) by setting the threshold to detect smaller energy transfers, there is an increased chance that electrical noise from the environment or conducted through the power line provided to the sensing circuitry will cause false triggerings of the sensor.

Averaging circuitry may be added to the sensing circuitry so as to diminish the effect of noise relative to the longer term signal generated and measured by the presence sensor. Such averaging circuitry, however, also slows the response of the presence sensor to changes in the presence or absence of an object it is detecting, thus limiting the application of such switches in cases where fast response is required.

SUMMARY OF THE INVENTION

The present inventors have recognized that electrical noise not only tends to be limited in the time domain, that is, to occur in bursts of limited duration, but that it is also limited in the frequency domain to occur, during any given burst, in a relatively narrow set of frequencies. Accordingly, an improved presence sensor can be constructed by applying to the sensing volume, a broadband electromagnetic signal and separately analyzing frequency bands of that signal to independently ascertain whether an object is present. Conflicts in these determinations at different frequencies, such as may be caused by electrical noise, is resolved by means of a voting circuit which adopts the output indicated by a majority of the determinations.

Specifically, the invention provides a method of sensing the presence of an object in a sensing volume including the steps of generating an electromagnetic signal composed of a plurality of different frequencies and electromagnetically communicating the electromagnetic signal to a sensing volume. Energy transfers to the sensing volume at the plurality of frequencies are separately detected and the energy transfers at the plurality of frequencies are compared to detect the presence of an object in the sensing volume and to provide an output signal.

Thus it is one object of the invention to provide a broadband presence sensor that may better resist frequency limited electrical noise.

The energy transfer at each frequency may be compared against a threshold indicating an energy transfer associated with the presence of the object to produce a frequency linked presence signal at each of the frequencies. The number of frequency linked presence signals indicating the presence of an object may be compared to the number of frequency linked presence signals indicating the absence of the object to determine the output signal. The comparison of the output signals observe a simple majority.

Thus it is another object of the invention to provide a simple voting method for eliminating artifacts caused by electromagnetic interference such as may provide a high degree of noise immunity even when multiple frequencies of the electromagnetic signal are obscured by electromagnetic noise.

The electromagnetic signal may be communicated to the sensing volume by an electrode capacitively coupled to an object in the sensing volume or by an inductor inductively coupled to the object in the sensing volume.

Thus it is another object of the invention to provide a technique that may be used for different types of electromagnetic presence sensors.

Each of the frequency linked sensor signals may be separately weighted in the comparison process.

Thus it is another object of the invention to provide a sensing of an object that is tailored to the particular frequency dependent characteristics of the object.

The amount of energy transfer may be detected by measuring changes in current or voltage at the different frequencies of the electromagnetic signal through or across a known impedance.

Thus it is another object of the invention to provide for a simple mechanism of measurement of energy transfer.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE INVENTION

Figure 1:
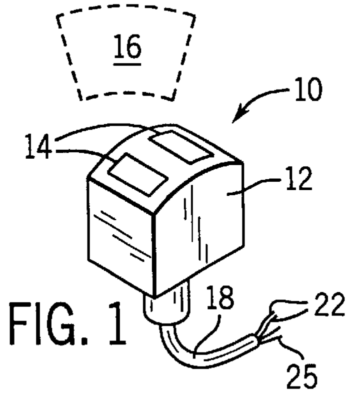
FIG. 1 is a perspective view of a presence sensor such as may incorporate the present invention, providing a housing holding a sensing circuit and having a upper surface supporting a sensing electrode or inductor and an output cable conducting an output signal indicating the presence of an object in a sensing volume above the upper surface.

Referring now to FIG. 1, a presence sensor 10 per the present invention includes a housing 12 supporting on one face, one or more electrode pads 14. Although the electrodes are shown for clarity, generally they are electrically insulated from an adjacent sensing volume 16. Cabling 18 may exit the presence sensor 10 providing power conductors 22 for conducting power to internal sensing circuitry (not shown) and at least output 25 providing a presence signal indicating the presence or absence of an object within the sensing volume 16.

Figure 2:
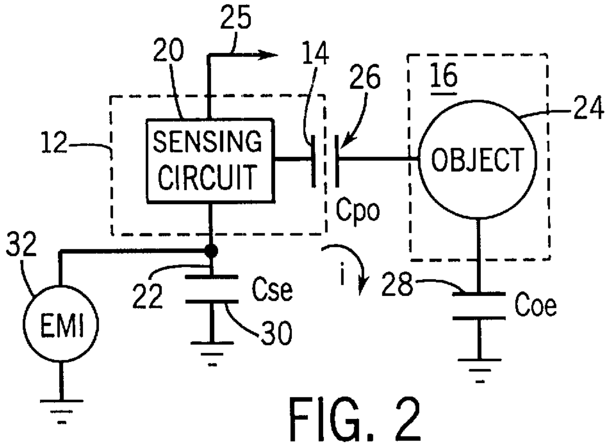
FIG. 2 is a schematic representation of the sensing circuit and electrode of FIG. 1 showing the effect of an object in the sensing volume and showing the introduction of noise into the sensing circuit.

Referring now to FIG. 2, the housing 12 holds sensing circuit 20 connecting to the electrode pad 14, the power conductors 22, and the output 25 providing the presence signal. During operation, an object 24 (such as a human hand) may move into the sensing volume 16 thereby establishing a capacitive coupling 26 with the electrode pad 14 indicated by capacitance $C_{po}$ (capacitance between the pad and the object). Capacitance $C_{po}$ provides a path of energy transfer from the electrode pad 14 into the object 24 and through a capacitive coupling 28 between the object and its environment indicated by capacitance $C_{oe}$ (capacitance between the object and earth). A completed circuit between the sensing circuit 20 and the object 24 is provided by capacitive coupling 30 indicated by capacitance $C_{se}$ (capacitance between the sensing circuit and earth). Alternatively, but not shown, the sensing circuit 20 may be directly coupled to earth. Capacitance $C_{oe}$ and $C_{se}$ result from the normal proximity and connection of the object 24 and sensing circuit 20 to their environments.

A noise source 32 may introduce a noise current into a junction between the sensing circuit 20 and capacitance $C_{se}$ causing a perturbation in the voltage level of the sensing circuit 20 with respect to earth. This perturbation can, for example, cause additional current to flow from the sensing circuit electrode pad 14 to the object 24 insofar as the energy transfer through the object 24 to earth will be in some part proportional to the voltage difference between electrode pad 14 and earth. Noise source 32 is intended to show one mechanism for the introduction of noise into the signals sensed by the sensing circuit 20 but generally the present invention will also address other avenues of noise introduction well known in the art including capacitive coupling or induction into other leads or points in the circuit.

The present inventors have recognized that in many situations, the noise source 32 is band limited, meaning that the noise is represented by a limited number of different frequencies over an arbitrary time interval. Accordingly, a broad-spectrum sensing signal may be used to decrease the influence of such noise signals.

Figure 3:
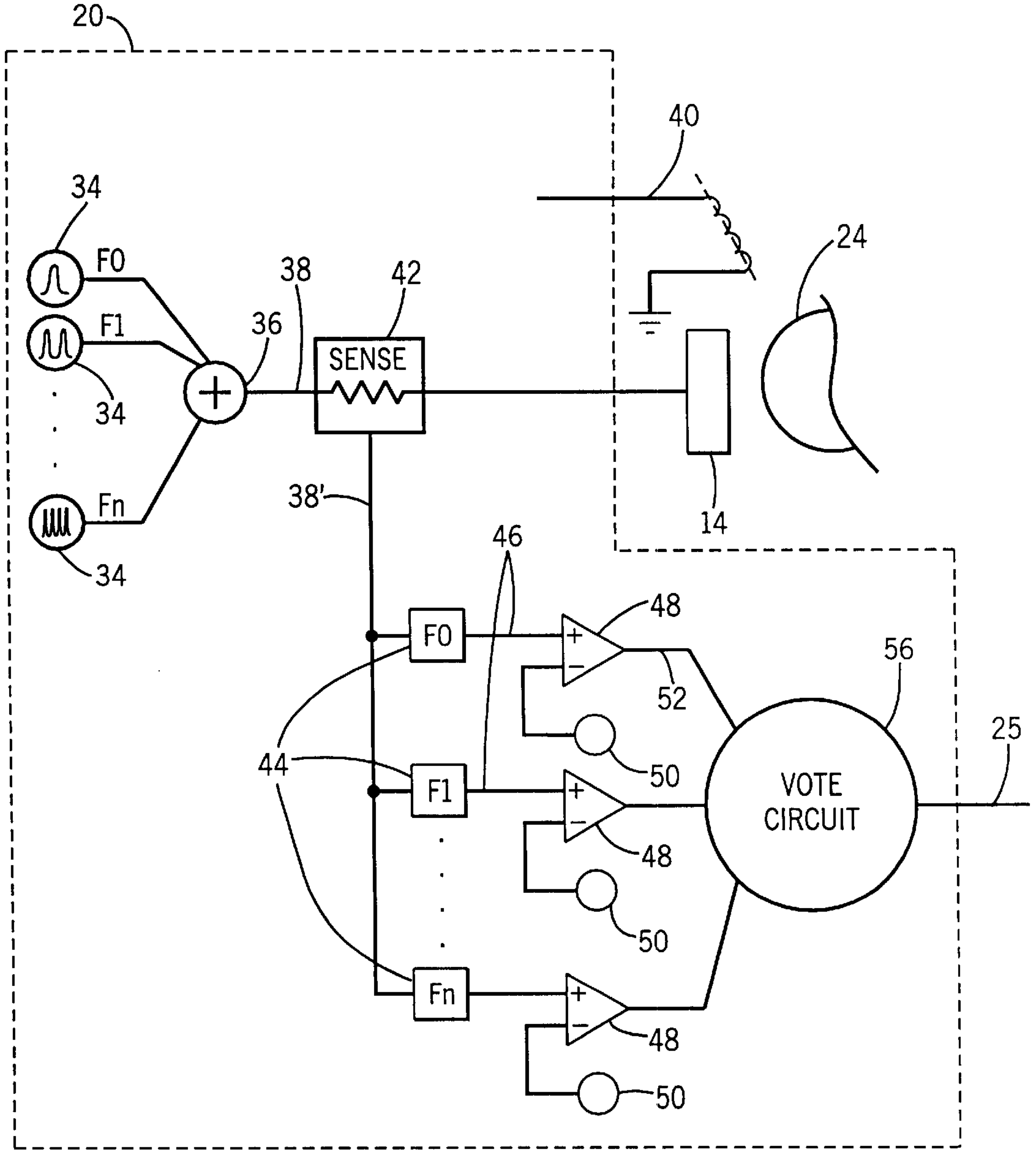
FIG. 3 is a detailed diagram of the sensing circuit of the present invention showing the generation of multiple frequencies to form the electromagnetic signal and their separation to provide separate frequency linked sensing signals that are combined by a voting circuit to produce the output signal.

Accordingly, referring now to FIG. 3, the sensing circuit 20 may include a plurality of frequency generators 34, each producing a relatively narrow band signal having spaced center frequencies $f_0$ through $f_n$. These signals may be produced by separate oscillator circuits of a type well known and combined by a summing circuit 36 to produce a composite waveform 38. Alternatively, the composite waveform 38 may be produced by digital synthesis of a single wave being the combination of the desired signals using a digital signal processor (DSP) of a type well known in the art. The frequencies are preferably in the range of 150 kHz to one MHz.

In yet a further alternative embodiment, different ones of the frequency generators 34 may be activated in sequence (with the outputs of the other frequency generators 34 effectively suppressed) so that an instantaneously narrow band signal is output from the summing circuit 36 but so that the composite waveform 38 is nevertheless composed of many frequencies when viewed over a period of time. This approach can simplify the synthesis of the composite waveform 38 and can simplify the decoding of frequency linked presence signals described below.

The composite waveform 38 is communicated to the electrode pad 14 where it creates a changing voltage such as may capacitively couple with the object 24. Alternatively in an inductive version of the invention, the composite waveform 38 may be conducted to an inductive coil antenna 40 providing a fluctuating magnetic field such as may inductively couple to the object 24.

The energy transferred from the frequency generators 34 and summing circuit 36 (or from an output of the DSP) to the object 24 may be detected by a sensor 42. In one embodiment, the sensor 42 is a resistor whose terminal voltage values indicate current flowing through the electrode pad 14 to the object 24. The output of the sensor 42 may thus provide a modified composite waveform 38', the modification typically being a change (amplitude increase or decrease or phase shift) in the voltage of the modified composite waveform 38' compared to the composite waveform 38, the change indicating the energy transfer to the object 24. Other sensing systems can be easily substituted for this including other current sensing devices or voltage sensors across more complex impedances than a resistor as shown.

The modified composite waveform 38' passes to a sequence of band-pass filters 44 having center frequencies corresponding to the frequencies $f_0$ through $f_n$ of the frequency generators 34. Each band pass filter 44 includes a peak detectors so as to produce an envelope signal 46 indicating the amplitude of the modified composite waveform 38' at a particular frequency $f_0$ through $f_n$ and a nominal bandwidth about those center frequencies. Again the band-pass filters 44 may be implemented as analog circuits or by means of a digital circuit including but not limited to a DSP executing a Fourier transform or the like.

The envelope signals 46 pass to comparators 48 which compare the envelope signals 46 to corresponding threshold value 50, a predetermined voltage below which an envelope signal 46 from the band-pass filters 44 would tend to indicate no object 24 is present in the sensing volume 16, and above which the envelope signal 46 from the band-pass filters 44 would tend to indicate that an object 24 is present in the sensing volume 16. The comparators 48 may be readily implemented either in analog circuitry according to well-known techniques or in digital circuitry, preferably according to a processing of a signal by the DSP.

Binary signals 52 from the outputs of the comparators 48 thus provide frequency linked presence signals each independently indicating the presence or absence of the object 24 in the sensing volume 16, as measured in a narrow frequency range. The binary signals 52 are combined in a voter circuit 56 which may operate under a simple majority principle to provide a single presence sensing output 25 corresponding to the state of the majority of the outputs of the comparators 48. Thus if most of the comparators 48 provide a signal indicating the presence of an object 24, the output 25 will indicate the presence of that object as well. Again the voter circuit 56 may be implemented as analog circuitry (for example by summing the binary voltages and comparing them against a threshold equal to 50% of the maximum sum) or by digital circuitry such as a simple program executed on the DSP.

The output 25 may be a simple digital signal or may be a more complex network compatible message for communication on a standard industrial networks such as DeviceNet or the like.

The threshold values 50, against which the envelope signals 46 at the different frequencies are compared, will generally be different, reflecting the relative contribution of each frequency $f_0$ through $f_n$ to the modified composite waveform 38'. The threshold values 50 need not adhere to this proportion, however, and may alternatively be set empirically to better discriminate the particular objects 24 intended to be sensed, or may automatically be calibrated through a process of adding and removing the object 24 from the sensing volume 16 to determine a division line between voltages indicating a presence of an object 24 and the lack of a presence of an object 24 and thus to establish the threshold. Adjustment of the threshold values 50 allows an arbitrary weighting to be imposed on the frequency linked presence signals.

When a simple majority voting rule is used by the voter circuit 56, an odd number of frequencies $f_0$ through $f_n$ is desired of no less than three frequencies. Other voting rules than simple majority may be used to provide more or less noise immunity including two-thirds majority rules that may provide for either more or less noise immunity depending on whether two-thirds of the signals must indicate a presence of the object or two-thirds of the signals may fail to indicate a presence of the object.

It will be understood from the above description that the techniques of the present invention can be applied not only to active sensors that produce a binary presence signal but also to active sensors that provide an analog output indicating, for example, a distance to a remote object as deduced by the amount of energy transfer. In this case the voting circuit compares the analog output reading at each frequency and ignores any minority, conflicting output readings that may have been corrupted by noise. It will be thus understood that the term presence sensor, as used herein, is intended to embrace active sensors that produce both binary and analog type presence outputs and that the invention is not limited to one type or the other.

It is specifically intended that the present invention not be limited to the embodiments and illustrations contained herein, but that modified forms of those embodiments including portions of the embodiments and combinations of elements of different embodiments also be included as come within the scope of the following claims.

What is claimed is:

1. A method of sensing an object in a sensing volume comprising the steps of:

(a) generating an electromagnetic signal at a plurality of different frequencies;

(b) electromagnetically communicating the electromagnetic signals to the sensing volume;

(c) separately detecting energy transfers to the sensing volume at the plurality of different frequencies; and (d) comparing the energy transfers at the plurality of different frequencies to detect the presence of the object in the sensing volume and to provide an output signal.

2. The method of claim 1 wherein the output signal is a binary signal indicating the presence or absence of the object.

3. The method of claim 1 wherein step (d) compares the energy transfer at each frequency against a threshold indicating an energy transfer associated with the presence of the object in the sensing volume to produce frequency linked presence signals and compares the number of frequency linked presence signals indicating the presence of the object with the number of frequency linked presence signals indicating the absence of an object to determine the output signal.

4. The method of claim 1 wherein the comparison sets the output signal to indicate a presence of the object when the number of frequency linked presence signals indicating the presence of the object is greater than the number of frequency linked presence signals indicating the absence of an object.

5. The method of claim 1 wherein the electromagnetic signal is communicated to the sensing volume by an electrode capacitively coupled to an object in the sensing area.

6. The method of claim 1 wherein the energy transfer is detected by measure of voltage at the different frequencies of the electromagnetic signal across an impedance.

7. The method of claim 1 wherein the object is a human hand.

8. An electronic presence sensor providing an output signal related to the presence of an object in a sensing volume, the electronic presence sensor comprising:

a signal generator producing an electromagnetic signal at a plurality of different frequencies;

a conductor positioned near the sensing volume to receive and electromagnetically communicate the electromagnetic signal to the sensing volume;

a sensing circuit detecting energy transfer to the sensing volume at the plurality of different frequencies; and a voting circuit comparing the energy transfer at the plurality of different frequencies to detect the presence of the object in the sensing volume and to provide the output signal.

9. The electronic presence sensor of claim 8 wherein the output signal is a binary signal indicating the presence or absence of the object.

10. The electronic presence sensor of claim 8 the voting circuit includes:

(a) a filter bank isolating the energy transfer at the different frequencies;

(b) a threshold comparison circuit comparing the isolated energy transfers at the different frequencies to thresholds indicating an energy transfer associated with the presence of the object in the sensing volume; and (c) a comparator comparing the energy transfers at particular frequencies exceeding the thresholds to the energy transfers at particular frequencies not exceeding the thresholds to produce the output signal.

11. The electronic presence sensor of claim 8 wherein comparator sets the output signal to indicate the presence of the object when the energy transfers at particular frequencies exceeding the thresholds is greater than the energy transfers at particular frequencies not exceeding the thresholds to produce the output signal.

12. The electronic presence sensor of claim 8 wherein the conductor is an electrode capacitively coupled to an object in the sensing area.

13. The electronic presence sensor of claim 8 wherein the signal generator connects to the conductor across an impedance and wherein the sensing circuit senses changes in a signal across the impedance.

14. The electronic presence sensor of claim 8 wherein the signal generator and voting circuit are implemented in a programmable digital signal processor.

* * * * *